(12) United States Patent
Uemura et al.

(10) Patent No.: US 10,944,926 B2
(45) Date of Patent: Mar. 9, 2021

(54) SOLID-STATE IMAGING ELEMENT, METHOD FOR DRIVING SOLID-STATE IMAGING ELEMENT, AND ELECTRONIC APPARATUS

(71) Applicant: SONY SEMICONDUCTOR SOLUTIONS CORPORATION, Kanagawa (JP)

(72) Inventors: Koushi Uemura, Kumamoto (JP); Shingo Sanada, Fukuoka (JP); Kiyoshige Tsuji, Kanagawa (JP); Hideyuki Hanada, Fukuoka (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/339,287

(22) PCT Filed: Aug. 16, 2017

(86) PCT No.: PCT/JP2017/029458
§ 371 (c)(1),
(2) Date: Apr. 3, 2019

(87) PCT Pub. No.: WO2018/087975
PCT Pub. Date: May 17, 2018

(65) Prior Publication Data
US 2020/0045253 A1    Feb. 6, 2020

(30) Foreign Application Priority Data

Nov. 8, 2016 (JP) .............................. JP2016-217849

(51) Int. Cl.
*H04N 5/359* (2011.01)
*H04N 5/369* (2011.01)
(Continued)

(52) U.S. Cl.
CPC ....... *H04N 5/3591* (2013.01); *H01L 27/1464* (2013.01); *H04N 5/36961* (2018.08); *H04N 5/3745* (2013.01)

(58) Field of Classification Search
None
See application file for complete search history.

(56) References Cited

U.S. PATENT DOCUMENTS

2008/0136933 A1*  6/2008  Dosluoglu ......... H04N 5/37457
                                            348/223.1
2010/0188540 A1*  7/2010  Bechtel .................. H04N 5/355
                                            348/302

(Continued)

FOREIGN PATENT DOCUMENTS

CN    102282839 A    12/2011
CN    104639848 A     5/2015
(Continued)

OTHER PUBLICATIONS

International Search Report and Written Opinion of PCT Application No. PCT/JP2017/029458, dated Nov. 7, 2017, 06 pages of ISRWO.

*Primary Examiner* — Mark T Monk
(74) *Attorney, Agent, or Firm* — Chip Law Group

(57) ABSTRACT

A solid-state imaging element of the present disclosure includes a pixel array unit in which unit pixels each including a photoelectric conversion unit are arranged two-dimensionally in a matrix, and a floating diffusion is shared between a plurality of the unit pixels, and a drive unit that drives to discard, into the floating diffusion, a part of a charge of a non-read pixel sharing the floating diffusion with a read pixel, during a reset period of the floating diffusion of the read pixel for reading the charge.

13 Claims, 10 Drawing Sheets

(51) Int. Cl.
*H01L 27/146* (2006.01)
*H04N 5/3745* (2011.01)

(56) References Cited

U.S. PATENT DOCUMENTS

| | | | |
|---|---|---|---|
| 2012/0019698 A1 | 1/2012 | Ui et al. | |
| 2013/0161774 A1* | 6/2013 | Okigawa | H04N 5/23212 |
| | | | 257/432 |
| 2015/0124139 A1* | 5/2015 | Ishiwata | H01L 27/14603 |
| | | | 348/308 |
| 2016/0261813 A1 | 9/2016 | Morita et al. | |

FOREIGN PATENT DOCUMENTS

| | | |
|---|---|---|
| EP | 2381674 A1 | 10/2011 |
| JP | 2010-171637 A | 8/2010 |
| JP | 2015-091025 A | 5/2015 |
| JP | 2016-163329 A | 9/2016 |
| WO | 2010/084695 A1 | 7/2010 |

* cited by examiner

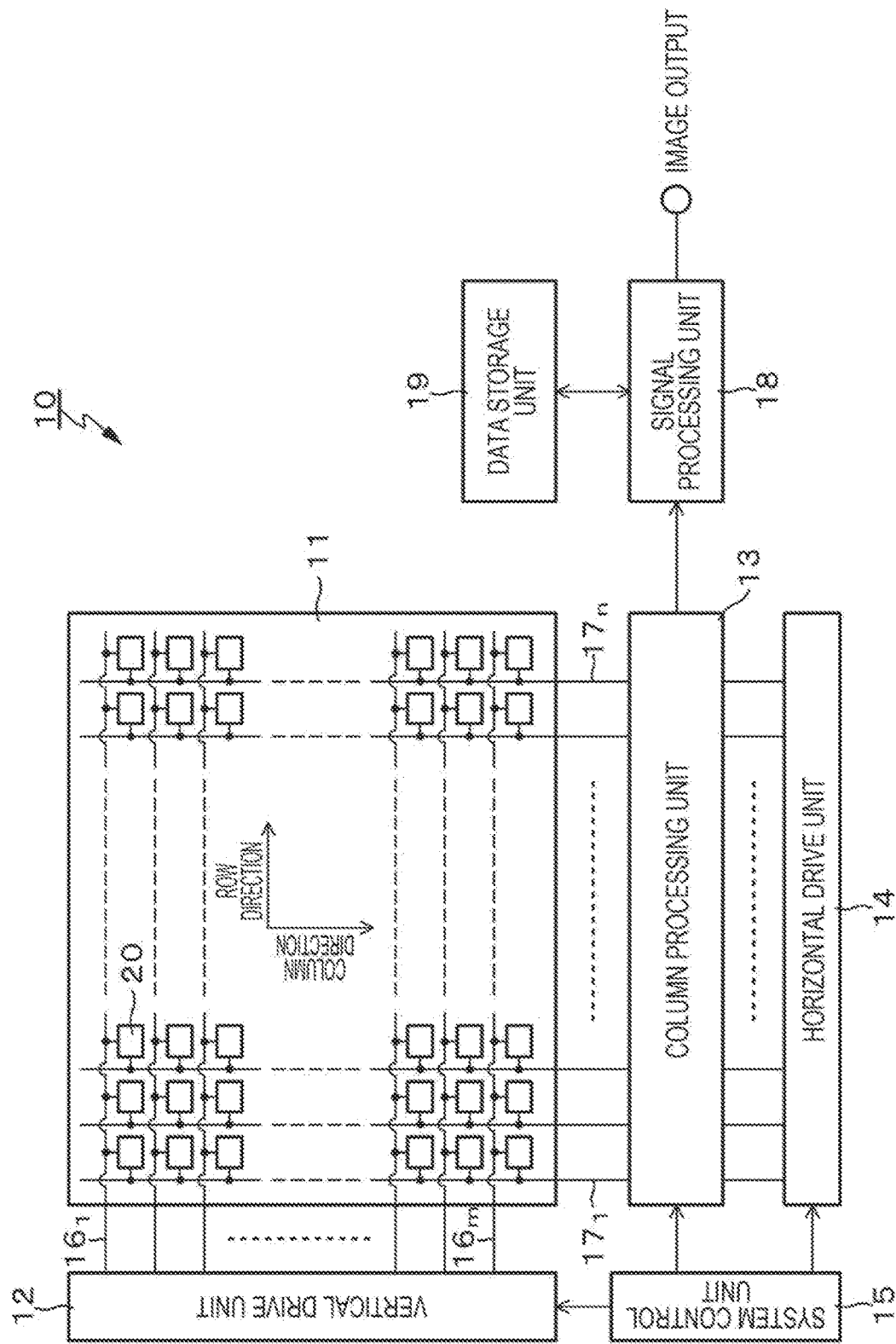

SOLID-STATE IMAGING ELEMENT, METHOD FOR DRIVING SOLID-STATE IMAGING ELEMENT, AND ELECTRONIC APPARATUS

CROSS REFERENCE TO RELATED APPLICATIONS

This application is a U.S. National Phase of International Patent Application No. PCT/JP2017/029458 filed on Aug. 16, 2017, which claims priority benefit of Japanese Patent Application No. JP 2016-217849 filed in the Japan Patent Office on Nov. 8, 2016. Each of the above-referenced applications is hereby incorporated herein by reference in its entirety.

TECHNICAL FIELD

The present disclosure relates to a solid-state imaging element, a method for driving a solid-state imaging element, and an electronic apparatus.

BACKGROUND ART

A phase difference detection system is known as one of auto focus (Auto Focus: AF) systems for automatically bringing a focused state (that is, focused state) on an imaging device. The auto focus of the phase difference detection system is a system in which the phase difference of a subject image is used by using two sensors, and a distance between a subject and an imaging lens is measured to adjust a focus. There is a solid-state imaging element having a configuration in which in order to realize the auto focus of this phase difference detection system, a phase difference detection pixel for detecting a phase difference is provided, in place of some imaging pixels, in a pixel array unit in which normal imaging pixels for generating a captured image are arranged two-dimensionally in a matrix.

In the solid-state imaging element for realizing the auto focus of the phase difference detection system, the phase difference detection pixel has a plurality of photoelectric conversion units. Furthermore, in order to improve the speed and accuracy of the auto focus, each of the plurality of photoelectric conversion units of the phase difference detection pixel shares a floating diffusion with the imaging pixel adjacent to the phase difference detection pixel (see, for example, Patent Document 1).

CITATION LIST

Patent Document

Patent Document 1: Japanese Patent Application Laid-Open No. 2015-91025 A

SUMMARY OF THE INVENTION

Problems to be Solved by the Invention

Incidentally, in a solid-state imaging element having a phase difference detection pixel provided in a pixel array unit, for example, in order to perform auto focus with high accuracy even in a dark environment, a charge accumulation time of a pixel row including a phase difference detection pixel may be set longer than that of a pixel row including a normal imaging pixel. As described above, in a case where the charge accumulation time of the pixel row including the phase difference detection pixel is set to be long, the photoelectric conversion unit of the phase difference detection pixel may overflow when a large amount of light is input. Then, when the photoelectric conversion unit of the phase difference detection pixel overflows, the charge overflowing from the phase difference detection pixel flows into the floating diffusion of the adjacent pixel sharing the floating diffusion, which causes blooming.

An object of the present disclosure is to provide a solid-state imaging element, a method for driving a solid-state imaging element, and an electronic apparatus having the solid-state imaging element, which can prevent a charge overflowing from the photoelectric conversion unit from flowing into a floating diffusion of an adjacent pixel sharing the floating diffusion.

Solutions to Problems

A solid-state imaging element according to the present disclosure for achieving the above object includes:

a pixel array unit in which unit pixels each including a photoelectric conversion unit are arranged two-dimensionally in a matrix, and a floating diffusion is shared between a plurality of the unit pixels; and a drive unit that drives to discard, into the floating diffusion, a part of a charge of a non-read pixel sharing the floating diffusion with a read pixel, during a reset period of the floating diffusion of the read pixel for reading the charge. Furthermore, the electronic apparatus according to the present disclosure for achieving the above object has a solid-state imaging element having the above configuration.

Furthermore, a method for driving a solid-state imaging element according to the present disclosure for achieving the above object includes, in driving a solid-state imaging element in which unit pixels each including a photoelectric conversion unit are arranged two-dimensionally in a matrix, and a floating diffusion is shared between a plurality of the unit pixels, discarding, into the floating diffusion, a part of a charge of a non-read pixel sharing the floating diffusion with a read pixel, during a reset period of the floating diffusion of the read pixel for reading the charge.

During the reset period of the floating diffusion of the read pixel, a part of the charge of the non-read pixel is discarded into the floating diffusion. Since the discarding operation is performed during the reset period, the discarded charge does not remain in the floating diffusion. Therefore, by discarding a part of the charge of the non-read pixel into the shared floating diffusion in advance during the reset period of the floating diffusion of the read pixel, the photoelectric conversion unit of the non-read pixel can be prevented from overflowing when a large amount of light is input. This prevents the charge of the non-read pixel from flowing into the floating diffusion of the adjacent pixel sharing the floating diffusion.

Effects of the Invention

According to the present disclosure, since the charge of the non-read pixel can be prevented from flowing into the floating diffusion of the adjacent pixel sharing the floating diffusion, the occurrence of blooming due to overflow can be suppressed.

It should be noted that the effects described herein are not necessarily limited, and any of the effects described in this description may be used. Furthermore, the effects described in this description are merely exemplary and not limited thereto, and additional effects may be provided.

BRIEF DESCRIPTION OF THE DRAWINGS

FIG. 1 is a system configuration diagram illustrating a basic system configuration of a solid-state imaging element according to an embodiment of the present disclosure.

MODE FOR CARRYING OUT THE INVENTION

Figure 2A:
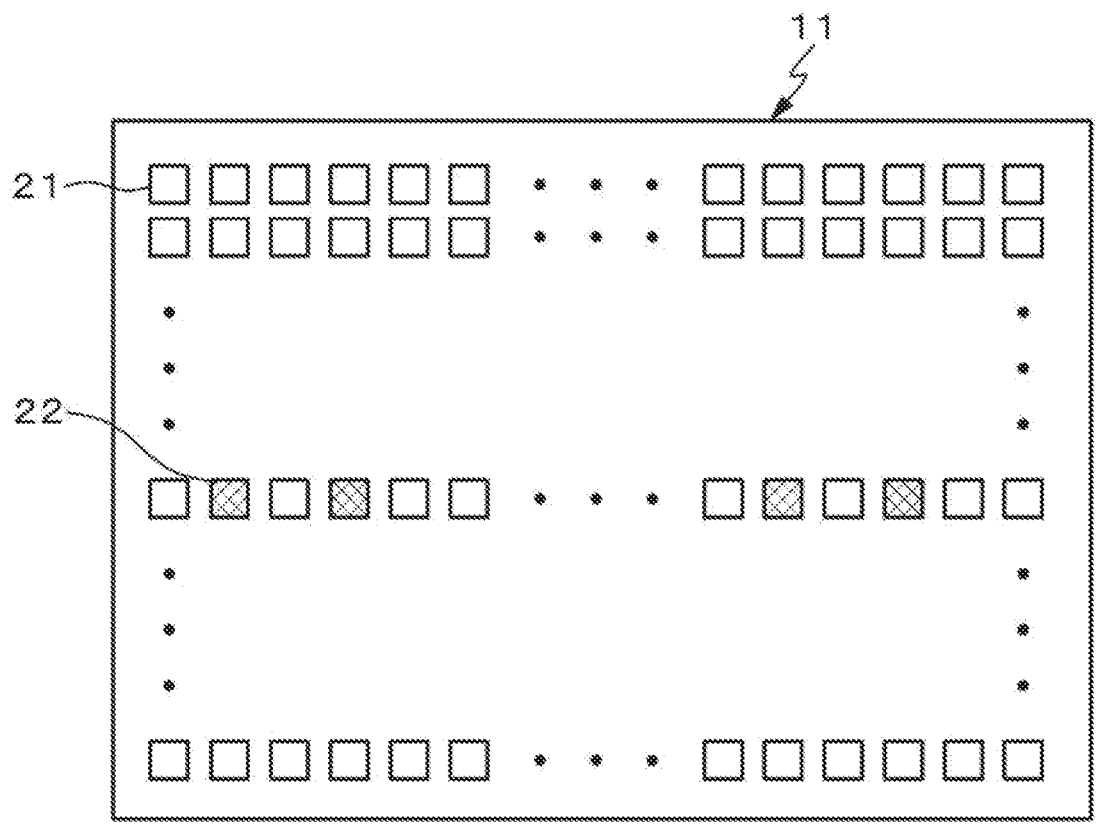
FIG. 2A is a diagram for explaining the pixel arrangement of a pixel array unit.

Hereinafter, the embodiment for implementing the technology of the present disclosure (hereinafter referred to as "embodiment") is described in detail with reference to the drawings. The technology of the present disclosure is not limited to the embodiment. In the following description, the same reference numerals are used for the same elements or elements having the same functions, and the duplicate description is omitted. Note that the description will be given in the following order.
1. Explanation relating to, in general, solid-state imaging element, method for driving solid-state imaging element, and electronic apparatus of the present disclosure
2. Basic system configuration
3. Pixel arrangement of pixel array unit
4. Circuit configuration of unit pixels
5. About occurrence of blooming
6. About measures against blooming
6-1. Embodiment (Specific examples of measures against blooming)
7. Back-illuminated type pixel structure
8. Modification
9. Electronic apparatus
9-1. Imaging device
10. Configuration that present disclosure can take
<Explanation Relating to, in General, Solid-State Imaging Element, Method for Driving Solid-State Imaging Element, and Electronic Apparatus of Present Disclosure>

In a solid-state imaging element, a method for driving a solid-state imaging element, and an electronic apparatus of the present disclosure, during a reset period of a floating diffusion of a read pixel, a drive unit can be configured to cause a height of a barrier under a gate of a transfer gate unit between the photoelectric conversion unit of the non-read pixel and the floating diffusion to be lower than a height of the barrier at a time of no charge transfer. Furthermore, the drive unit can be configured to apply a voltage lower than a voltage at a time of charge transfer to a gate electrode of the transfer gate unit during the reset period of the floating diffusion of the read pixel.

In the solid-state imaging element, the method for driving the solid-state imaging element, and the electronic apparatus of the present disclosure that include the preferred configuration described above, the non-read pixel sharing the floating diffusion may be a phase difference detection pixel for performing phase difference detection for measuring a distance from the subject using a phase difference of a subject image.

Furthermore, in the solid-state imaging element, the method for driving the solid-state imaging element, and the electronic apparatus of the present disclosure that include the preferred configuration described above, the phase difference detection pixel may be configured to have a first photoelectric conversion unit and a second photoelectric conversion unit. In this case, it is preferable for the first photoelectric conversion unit to share a floating diffusion with a pixel adjacent to a first side of the phase difference detection pixel. Furthermore, in this case, it is preferable for the second photoelectric conversion unit to share a floating diffusion with a pixel adjacent to a second side of the phase difference detection pixel.

Furthermore, in the solid-state imaging element, the method for driving the solid-state imaging element, and the electronic apparatus of the present disclosure that include the preferred configuration described above, it is preferable for the unit pixel to have a back-illuminated type pixel structure.

[Basic System Configuration]

FIG. 1 is a system configuration diagram illustrating a basic system configuration of the solid-state imaging element according to an embodiment of the present disclosure. Here, a CMOS image sensor which is a kind of a solid-state imaging element of an X-Y address system will be described as the solid-state imaging element according to the present embodiment. A CMOS image sensor is an image sensor made by applying or partially using a CMOS process.

A solid-state imaging element 10 according to this embodiment is configured to have a pixel array unit 11 formed on a semiconductor substrate (semiconductor chip) not illustrated, and a peripheral circuit unit integrated on the same semiconductor substrate as the pixel array unit 11. The peripheral circuit unit includes, for example, a vertical drive unit 12, a column processing unit 13, a horizontal drive unit 14, and a system control unit 15.

The solid-state imaging element 10 further includes a signal processing unit 18 and a data storage unit 19. The signal processing unit 18 and the data storage unit 19 may be mounted on the same substrate as the solid-state imaging element 10, or may be arranged on a substrate different from the solid-state imaging element 10. Furthermore, each processing of the signal processing unit 18 and the data storage unit 19 may be performed by an external signal processing unit, such as, for example, a DSP (Digital Signal Processor) circuit provided on a substrate different from the solid-state imaging element 10 or software.

The pixel array unit 11 has a configuration in which unit pixels (hereinafter sometimes simply referred to as "pixel") 20 including the photoelectric conversion unit for generating and accumulating photocharge corresponding to the amount of received light by performing photoelectric conversion are two-dimensionally arranged in a row direction and a column direction, that is, in a matrix. Here, the row direction refers to an arrangement direction (that is, in a horizontal direction) of pixels in a pixel row, and the column direction refers to an arrangement direction (i.e., in a vertical direction) of pixels in a pixel column. The detailed circuit configuration and pixel structure of the unit pixel 20 will be described later.

In the pixel array unit 11, with respect to a matrix pixel array, pixel drive lines 16 ($16_1$ to $16_m$) are wired along the row direction for each pixel row, and vertical signal lines 17 ($17_1$ to $17_n$) are wired along the column direction for each pixel column. The pixel drive line 16 transmits a drive signal to be described later for performing driving when a signal is read from a pixel. In FIG. 1, the pixel drive line 16 is illustrated as one line, but it is not limited to one. One end of the pixel drive line 16 is connected to an output terminal corresponding to each row of the vertical drive unit 12.

The vertical drive unit 12 includes a shift register, an address decoder, and the like, and drives each pixel 20 of the pixel array unit 11 at the same time or in units of rows of all pixels. That is, the vertical drive unit 12 constitutes a drive unit that drives each pixel 20 of the pixel array unit 11 together with the system control unit 15 that controls the vertical drive unit 12. Although the specific configuration of the vertical drive unit 12 is not illustrated, the vertical drive unit 12 is generally configured to have two scanning systems that are a read scanning system and a sweep scanning system.

The read scanning system sequentially selects and scans the unit pixels 20 of the pixel array unit 11 in row units in order to read signals from the unit pixels 20. Each of the signals read from the unit pixels 20 is an analog signal. The sweep scanning system performs a sweep scanning ahead of a read scanning by a time corresponding to a shutter speed with respect to a read row on which the read scanning is performed by the read scanning system.

By sweep scanning with this sweep scanning system, unnecessary charges are swept out from the photoelectric conversion unit of the unit pixel 20 on the read row, and the photoelectric conversion unit is reset. Then, the so-called electronic shutter operation is performed by sweeping out (resetting) the unnecessary charges by the sweep scanning system. Here, the electronic shutter operation refers to an operation of discarding the photocharge of the photoelectric conversion unit and starting a new exposure (starting photocharge accumulation).

The signal read by a read operation by the read scanning system corresponds to the amount of light received after an immediately preceding read operation or after an electronic shutter operation. Then, a period from a read timing by the immediately preceding read operation or a sweep timing by the electronic shutter operation to a read timing by the current read operation is an exposure period of the photocharge in the unit pixel 20.

The signal output from each unit pixel 20 on the pixel row selectively scanned by the vertical drive unit 12 is input to the column processing unit 13 through each of the vertical signal lines 17 for each pixel column. The column processing unit 13 performs predetermined signal processing on the signal output from each pixel 20 of the selected row through the vertical signal lines 17 for each pixel column of the pixel array unit 11, and temporarily holds the pixel signals after signal processing.

Specifically, the column processing unit 13 performs at least noise removal processing, such as, for example, CDS (Correlated Double Sampling) processing and DDS (Double Data Sampling) processing, as signal processing. For example, by the CDS processing, a fixed pattern noise inherent to the pixel such as a reset noise and a threshold variation of the amplification transistor in the pixel 20 is removed. In addition to the noise removal processing, the column processing unit 13 may be provided with an AD (analog to digital) conversion function, for example, and an analog pixel signal can be converted into a digital signal and the converted signal can be output.

The horizontal drive unit 14 includes a shift register, an address decoder, and the like, and sequentially selects unit circuits corresponding to the pixel columns of the column processing unit 13. By the selection scanning by the horizontal drive unit 14, the column processing unit 13 sequentially outputs pixel signals subjected to signal processing for each unit circuit.

The system control unit 15 includes a timing generator or the like which generates various timing signals, and performs drive control of the vertical drive unit 12, the column processing unit 13, and the horizontal drive unit 14 on the basis of various timings generated by the timing generator.

The signal processing unit 18 has at least an arithmetic processing function, and performs various signal processing such as arithmetic processing on the pixel signal output from the column processing unit 13. The data storage unit 19 temporarily stores data necessary for signal processing in the signal processing unit 18.

In the solid-state imaging element 10 having the above-described configuration, the technology of the present disclosure is characterized by a circuit configuration of the unit pixel 20 and a driving timing of the drive unit of the unit pixel 20, particularly the vertical drive unit 12. A specific embodiment of the circuit configuration of the unit pixel 20 and the driving timing of the vertical drive unit 12 will be described later.

Note that the system configuration described above is an example and is not limited thereto. For example, there may be a system configuration in which the data storage unit 19 is disposed in a subsequent stage of the column processing unit 13, and the pixel signal output from the column processing unit 13 is supplied to the signal processing unit 18 via the data storage unit 19. Alternatively, there may be a system configuration in which the column processing unit 13 is provided with an AD conversion function for performing AD conversion for each column or for each of a plurality of columns of the pixel array unit 11 and the data storage unit 19 and the signal processing unit 18 are connected in parallel with the column processing unit 13.

[Pixel Arrangement of Pixel Array Unit]

Figure 2B:
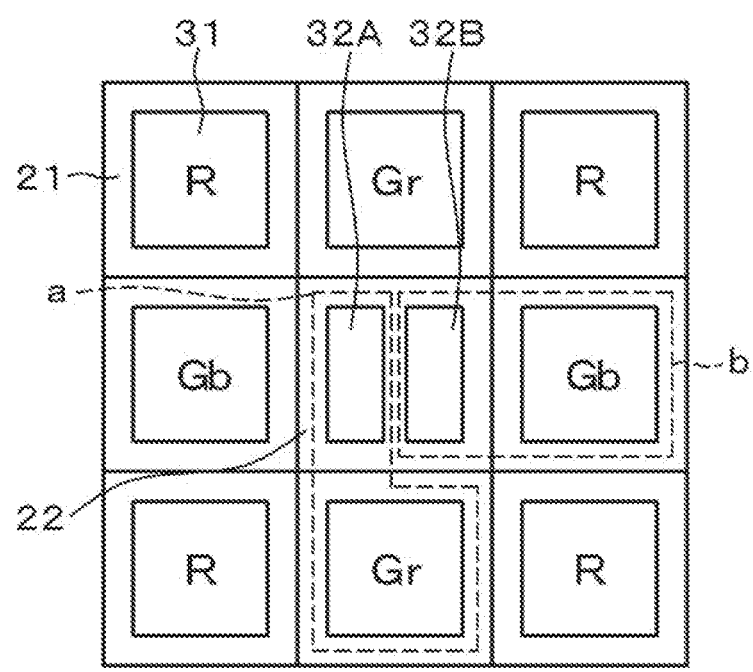
FIG. 2B is a diagram for explaining a pixel sharing in which a floating diffusion is shared between pixels.

Next, a pixel arrangement of the pixel array unit 11 of the solid-state imaging element 10 according to the present embodiment will be described more specifically with reference to FIGS. 2A and 2B. FIG. 2A is a diagram for explaining the pixel arrangement of the pixel array unit 11, and FIG. 2B is a diagram for explaining a pixel sharing in which a floating diffusion is shared between pixels.

The unit pixel 20 includes a normal imaging pixel 21 for generating a captured image, and a phase difference detection pixel 22 for performing a phase difference detection. As illustrated in FIG. 2A, the imaging pixels 21 (white square in FIG. 2A) are two-dimensionally arranged in a matrix in the pixel array unit 11. The imaging pixel 21 includes a R pixel in which a red color filter layer is formed to receive red light, a G pixel in which a green color filter layer is formed to receive green light, and a B pixel in which a blue color filter layer is formed to receive blue light, and these pixels are regularly arranged according to the Bayer arrangement.

Although the array of each pixel of RGB is illustrated here, this is an example and is not limited to the pixel array of RGB. For example, the pixel array may include a pixel that receives white light or a pixel that receives complementary color light such as yellow.

As illustrated in FIG. 2A, the phase difference detection pixels 22 (shaded squares in FIG. 2A) are scattered in the imaging pixels 21 two-dimensionally arranged in a matrix. Specifically, the phase difference detection pixels 22 are regularly arranged in a specific pattern in the pixel array unit 11 in place of some of the imaging pixels 21. Note that the arrangement of the imaging pixel 21 and the phase difference detection pixel 22 is not limited to the arrangement illustrated in FIG. 2A, and the imaging pixel 21 and the phase difference detection pixel 22 may be arranged in another pattern.

As illustrated in FIG. 2B, the imaging pixel 21 includes one photoelectric conversion unit 31. The imaging pixel 21 photoelectrically converts the received image light of the subject by the photoelectric conversion unit 31, and outputs a signal for generating a captured image. The phase difference detection pixel 22 includes a first photoelectric conversion unit 32A and a second photoelectric conversion unit 32B. The first photoelectric conversion unit 32A and the second photoelectric conversion unit 32B are used for phase difference detection in which a distance from the subject is measured using the phase difference of the subject image. That is, the phase difference detection pixel 22 photoelectrically converts the received image light of the subject by the first photoelectric conversion unit 32A and the second photoelectric conversion unit 32B, thereby outputting a signal for performing phase difference detection, which is used for auto focus of the phase difference detection system.

In the phase difference detection pixel 22, the first photoelectric conversion unit 32A and the second photoelectric conversion unit 32B share a floating diffusion (floating diffusion region/impurity diffusion region) described later with the photoelectric conversion unit 31 of the imaging pixel 21 adjacent to the phase difference detection pixel 22. For example, as illustrated in FIG. 2B, the first photoelectric conversion unit 32A shares a floating diffusion with the photoelectric conversion unit 31 of the imaging pixel 21 adjacent to a first side (lower side of FIG. 2B) of the phase difference detection pixel 22 (combination enclosed by a dashed line a in FIG. 2B). The second photoelectric conversion unit 32B shares a floating diffusion with the photoelectric conversion unit 31 of the imaging pixel 21 adjacent to a second side (right side of FIG. 2B) of the phase difference detection pixel 22 (combination enclosed by a dashed line b in FIG. 2B).

The floating diffusion shared between the phase difference detection pixel 22 and the imaging pixel 21 adjacent to the first side of the phase difference detection pixel 22 converts a charge photoelectrically converted by the photoelectric conversion unit 31 or the first photoelectric conversion unit 32A into a voltage. The floating diffusion shared between the phase difference detection pixel 22 and the imaging pixel 21 adjacent to the second side of the phase difference detection pixel 22 converts a charge photoelectrically converted by the photoelectric conversion unit 31 or the second photoelectric conversion unit 32B into a voltage.

Note that a combination of the phase difference detection pixel 22 and the imaging pixel 21 adjacent to the phase difference detection pixel 22 is not limited to the combination illustrated in FIG. 2B. For example, a combination of the phase difference detection pixel 22 and the imaging pixel 21 vertically adjacent to the phase difference detection pixel 22 may be used. In FIG. 2B, a Gr pixel refers to the G pixel of the pixel row including the R pixel, and a Gb pixel refers to the G pixel of the pixel row including the B pixel.

[Circuit Configuration of Unit Pixels]

Figure 3:
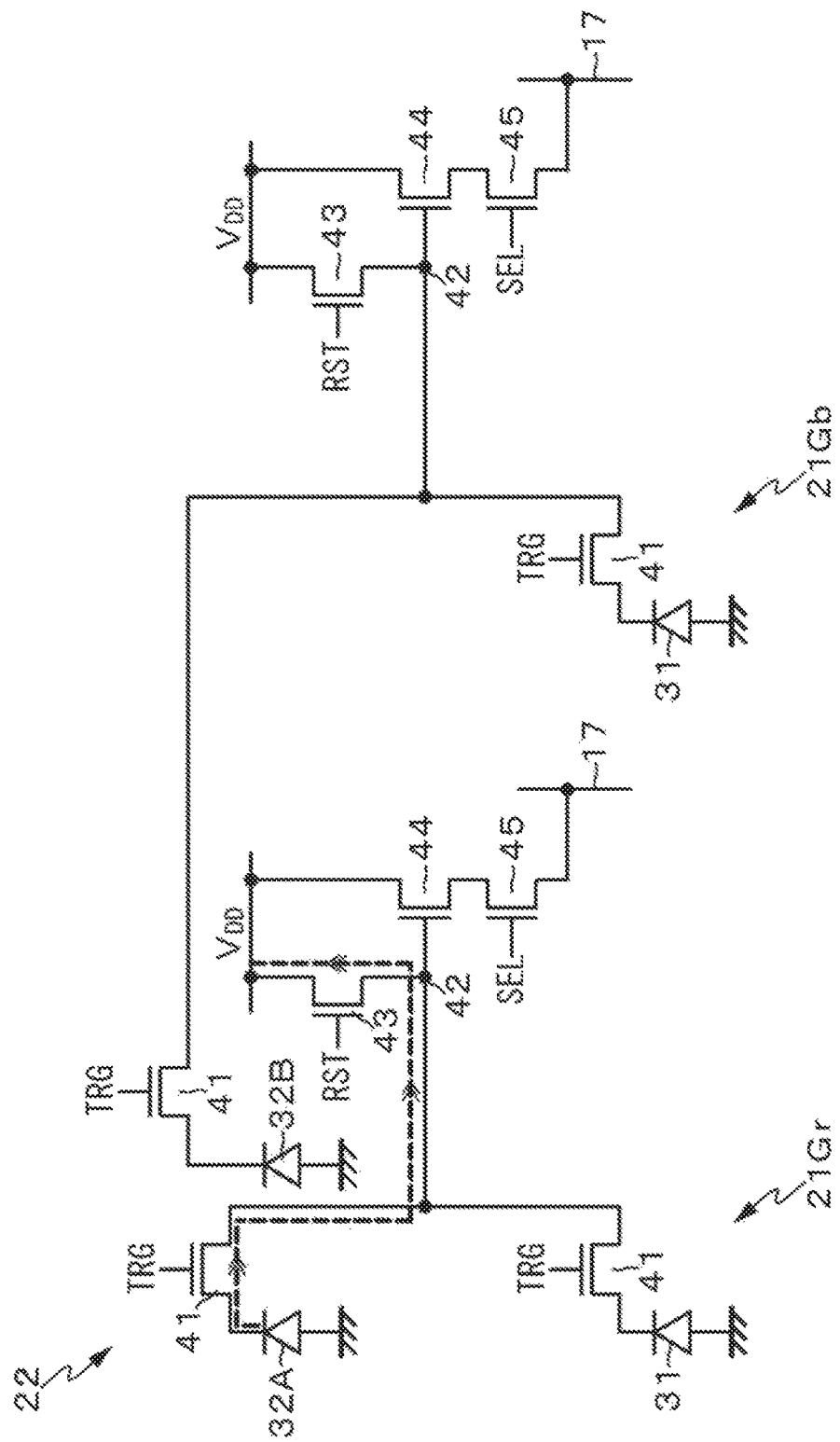
FIG. 3 is a circuit diagram illustrating an example of a circuit configuration of an imaging pixel sharing the floating diffusion and a phase difference detection pixel.

Next, the circuit configuration of the imaging pixel 21 and the phase difference detection pixel 22 sharing the floating diffusion will be described with reference to FIG. 3. FIG. 3 is a circuit diagram illustrating an example of the circuit configuration of the imaging pixel 21 sharing the floating diffusion and the phase difference detection pixel 22. FIG. 3 illustrates a circuit configuration of one phase difference detection pixel 22 in FIG. 2B and a circuit configuration of two imaging pixels 21Gr and 21Gb adjacent to the phase difference detection pixel 22.

In addition to the photoelectric conversion unit 31, the imaging pixels 21Gr and 21Gb each have a transfer transistor 41 which is a transfer gate unit, a floating diffusion (FD) 42, a reset transistor 43, an amplification transistor 44, and a selection transistor 45. The photoelectric conversion unit 31 is made of, for example, a photodiode PD.

Furthermore, in addition to the first photoelectric conversion unit 32A and the second photoelectric conversion unit 32B, the phase difference detection pixel 22 has the transfer transistor (transfer gate unit) 41, the floating diffusion 42, the reset transistor 43, the amplification transistor 44, and the selection transistor 45. The first photoelectric conversion unit 32A and the second photoelectric conversion unit 32B are made of, for example, a photodiode PD.

Here, in the phase difference detection pixel 22, the first photoelectric conversion unit 32A shares the floating diffusion 42, the amplification transistor 44, and the selection transistor 45 of the imaging pixel 21Gr (see FIG. 2B) adjacent to a lower side of the phase difference detection pixel 22 with the photoelectric conversion unit 31. Furthermore, the second photoelectric conversion unit 32B shares the floating diffusion 42, the amplification transistor 44, and the selection transistor 45 of the imaging pixel 21Gb (see FIG. 2B) adjacent to a right side of the phase difference detection pixel 22 with the photoelectric conversion unit 31.

When a transfer pulse TRG is applied to a gate electrode from the vertical drive unit 12 (see FIG. 1), the transfer transistor 41 transfers the charge that has been photoelectrically converted by the photoelectric conversion unit 31/the first photoelectric conversion unit 32A/the second photoelectric conversion unit 32B to the floating diffusion 42. The floating diffusion 42 converts the (read) charge transferred from the photoelectric conversion unit 31/the first photoelectric conversion unit 32A/the second photoelectric conversion unit 32B into a voltage. When a reset pulse RST is applied from the vertical drive unit 12 to the gate electrode, the reset transistor 43 resets the floating diffusion 42.

The amplification transistor 44 outputs a pixel signal converted into a voltage by the floating diffusion 42 to the vertical signal line 17 through the selection transistor 45. When the selection pulse SEL is applied from the vertical drive unit 12, the selection transistor 45 selectively connects the amplification transistor 44 to the vertical signal line 17.

As described above, in the phase difference detection pixel 22, since the two photoelectric conversion units 32A and 32B share the floating diffusion 42 and the amplification transistor 44 of different adjacent pixels, exposure and reading of the two photoelectric conversion units 32A and 32B can be performed simultaneously.

In the above circuit configuration, for example, with respect to the first photoelectric conversion unit 32A of the phase difference detection pixel 22, a path from the first photoelectric conversion unit 32A through the transfer transistor 41, and the reset transistor 43, to the power supply $V_{DD}$ is an overflow path, the path being indicated by a broken line in FIG. 3.

[About Occurrence of Blooming]

In the above described solid-state imaging element 10 having the phase difference detection pixel 22, for example, in order to perform auto focus with high accuracy even in a dark environment, a charge accumulation time (exposure time) of a pixel row including the phase difference detection pixel 22 may be set longer than that of a pixel row including the imaging pixels 21Gr and 21Gb. When the accumulation time is set to be long, the first photoelectric conversion unit 32A and the second photoelectric conversion unit 32B of the phase difference detection pixel 22 overflow in a case where a large amount of light is input, which causes blooming.

Figure 4:
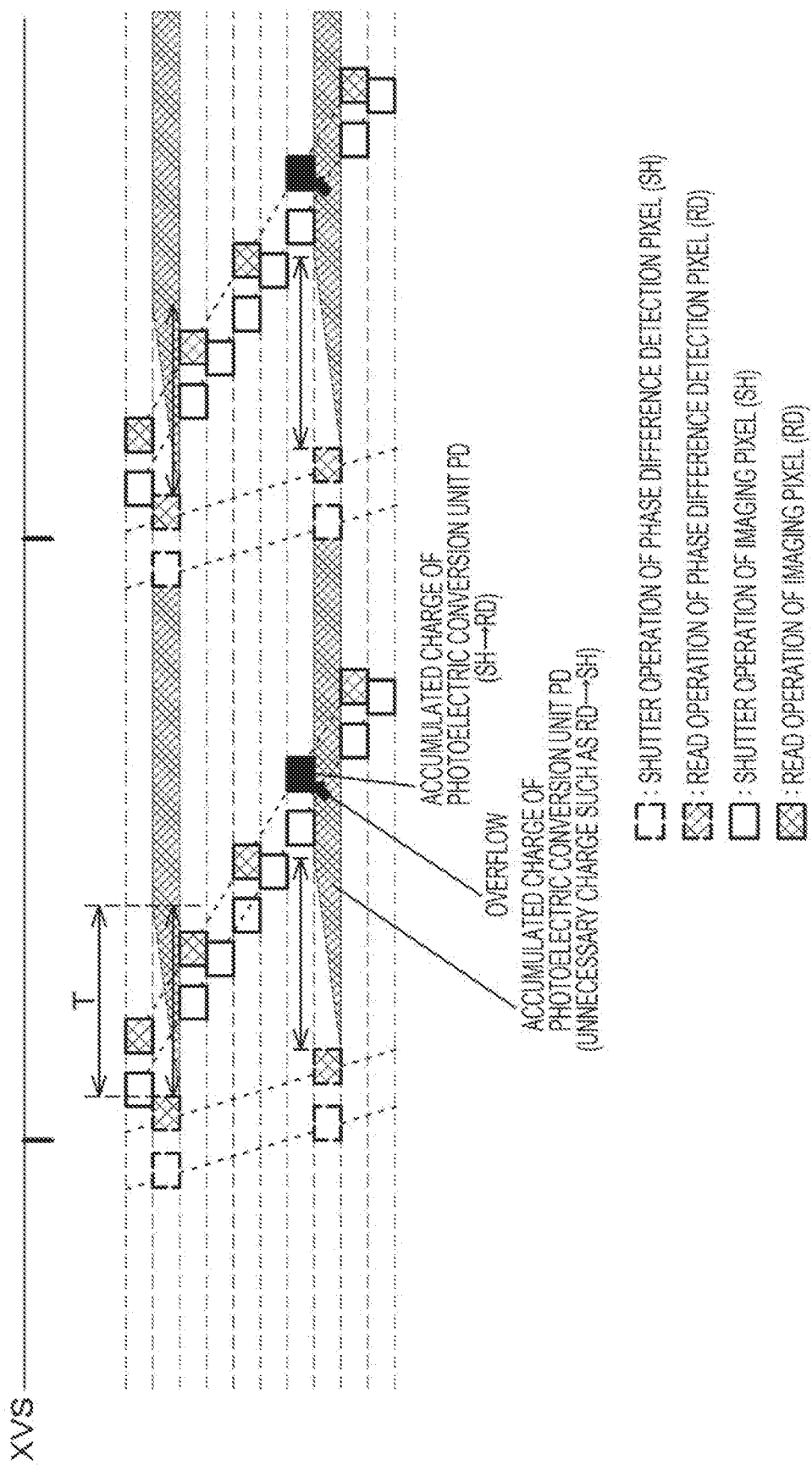
FIG. 4 is an explanatory diagram of a cause of an occurrence of blooming.

Here, the cause of the occurrence of the blooming will be specifically described with reference to FIG. 4. FIG. 4 is an explanatory diagram of the cause of the occurrence of the blooming.

In FIG. 4, XVS indicates a vertical synchronizing signal, and T indicates a time until a charge overflows in the photoelectric conversion units 32A and 32B of the phase difference detection pixel 22. Furthermore, an outlined dashed square represents the phase difference detection pixel 22 at the shutter timing, a shaded dashed square represents the phase difference detection pixel 22 at the read timing, an outlined solid square represents the imaging pixel 21 at the shutter timing, and a shaded solid square represents the imaging pixel 21 at the read timing.

After the read timing of the phase difference detection pixel 22, an unnecessary charge is accumulated in the first photoelectric conversion unit 32A and the second photoelectric conversion unit 32B, and when a time T elapses, the charge overflows from the first photoelectric conversion unit 32A and the second photoelectric conversion unit 32B (overflow). Then, when the first photoelectric conversion unit 32A and the second photoelectric conversion unit 32B overflow, the charge overflowing from the phase difference detection pixel 22 flows into the floating diffusion 42 shared with the imaging pixel 21, and is accumulated in the floating diffusion 42.

Accordingly, when a charge is read from the photoelectric conversion unit 31 to the floating diffusion 42 in the imaging pixel 21, the unnecessary charge overflowing from the first photoelectric conversion unit 32A and the second photoelectric conversion unit 32B is added to an original signal charge as an extra charge for the imaging pixel 21. As a result, blooming occurs, and this is recognized as a whitish floating horizontal stripe, which causes deterioration of the image quality of the captured image.

Note that, here, although the description has been made by taking a case where the charge accumulation time of the pixel row including the phase difference detection pixel 22 is set to be long as an example, it is not limited to the pixel row including the phase difference detection pixel 22. It is also considered that blooming occurs in an image row including the normal imaging pixel 21 by setting the accumulation time.

Figure 5:
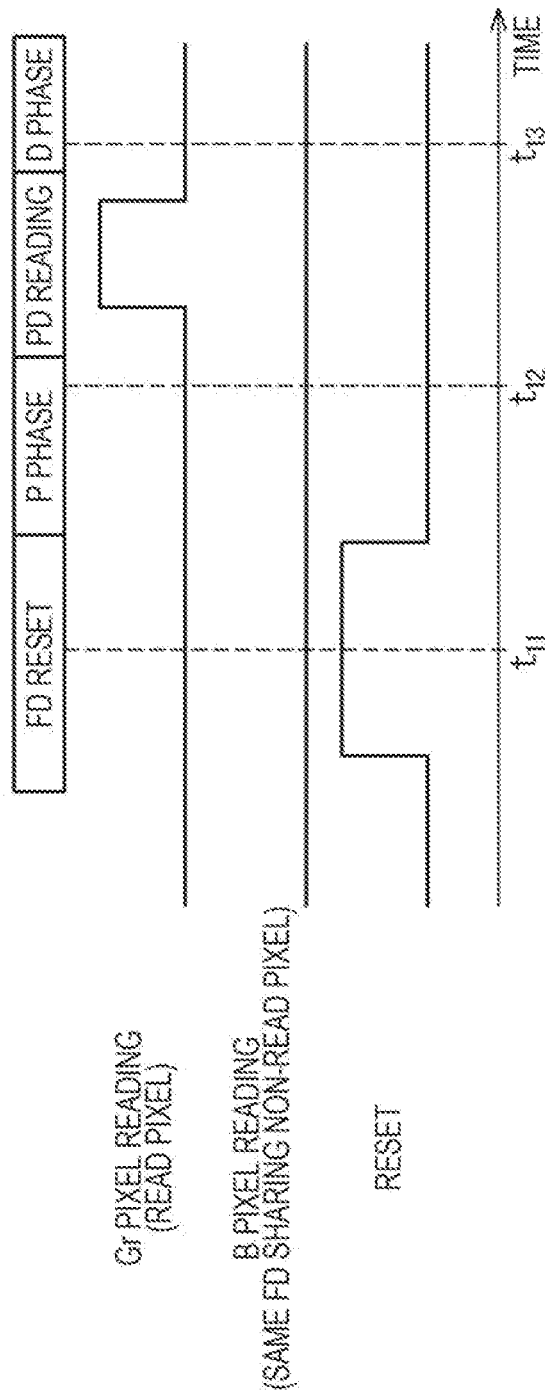
FIG. 5 is a timing chart for explaining a pixel operation in a case where a technology of the present disclosure is not applied.
Figure 6A:
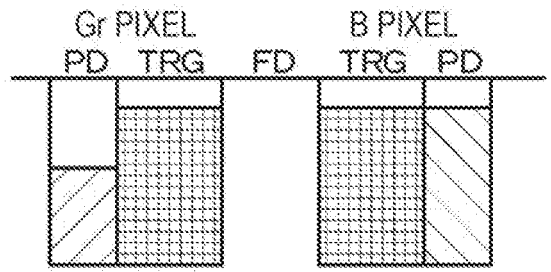
FIG. 6A is a diagram for explaining an operation at timing $t_{11}$ of FIG. 5.
Figure 6B:
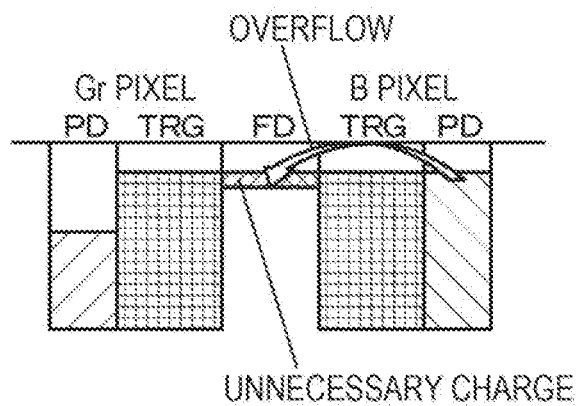
FIG. 6B is a diagram for explaining an operation at timing $t_{12}$ of FIG. 5.
Figure 6C:
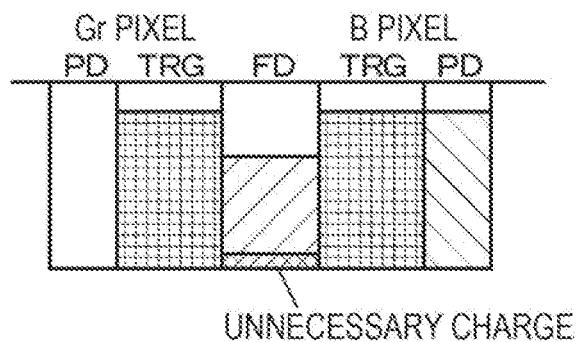
FIG. 6C is a diagram for explaining an operation at timing $t_{13}$ in FIG. 5.

The occurrence of blooming in the image row including the normal imaging pixel 21 will be described with reference to FIGS. 5, 6A, 6B, and 6C. FIG. 5 is a timing chart for explaining a pixel operation in a case where the technology of the present disclosure is not applied. FIGS. 6A, 6B, and 6C are operation explanatory diagrams illustrating a potential of the photoelectric conversion unit (PD), a barrier under a gate of the transfer gate unit (transfer transistor 41), and a potential of the floating diffusion (FD) at each timing in FIG. 5.

FIG. 5 illustrates a timing relationship between a transfer pulse TRG of a pixel row including a read pixel for reading an accumulated charge, a transfer pulse TRG of a pixel row including a non-read pixel sharing the same floating diffusion 42 with the read pixel, and a reset pulse RST. Here, as an example, a read pixel is referred to as a Gr pixel and a non-read pixel is referred to as a B pixel.

FIG. 6A illustrates a diagram for explaining an operation at timing $t_{11}$ of FIG. 5, FIG. 6B illustrates a diagram for explaining an operation at timing $t_{12}$ of FIG. 5, and FIG. 6C illustrates a diagram for explaining an operation at timing $t_{13}$ in FIG. 5. Here, the timing $t_{11}$ is a reset timing of the floating diffusion FD. The timing $t_{12}$ is a read timing for a signal (so-called P phase) after resetting the floating diffusion FD. The timing $t_{13}$ is a timing for reading a signal (so-called D phase) after a charge is read from the photoelectric conversion unit PD to the floating diffusion FD.

As illustrated in FIG. 6A, after resetting the floating diffusion FD, the B pixel, which is a non-read pixel, reaches a saturation level. Then, as illustrated in FIG. 6B, during the period of the P phase, the unnecessary charge of the B pixel passes through the barrier under the gate of the transfer transistor 41 and flows into the floating diffusion FD shared with the Gr pixel. As illustrated in FIG. 6C, this overflowed unnecessary charge is added to the original signal charge of the Gr pixel during a D phase period, and as a result, blooming due to overflow of the unnecessary charge from adjacent pixel occurs, and the blooming is visually recognized as a whitish floating horizontal stripe.

[About Measures Against Blooming]

Therefore, in the solid-state imaging element 10 according to the present embodiment, during the reset period of the floating diffusion FD of the read pixel for reading the charge, a part of the charge of the non-read pixel sharing the floating diffusion FD with the read pixel is discarded to the floating diffusion FD. Since the operation of discarding a part of the charge of the non-read pixel is a reset period of the floating diffusion FD, the discarded charge does not remain in the floating diffusion FD.

Therefore, by discarding a part of the charge of the non-read pixel into the floating diffusion FD shared with the read pixel in advance during the reset period of the floating diffusion FD of the read pixel, the photoelectric conversion unit of the non-read pixel PD can be prevented from overflowing when a large amount of light is input. As a result, since the unnecessary charge of the non-read pixel can be prevented from flowing into the floating diffusion FD of the adjacent pixel sharing the floating diffusion FD, the occurrence of blooming due to the overflow of the unnecessary charge from the adjacent pixel can be suppressed.

Embodiment

A specific embodiment of discarding a part of the charge of the non-read pixel into the shared floating diffusion FD during the reset period of the floating diffusion FD of the read pixel will be described below.

In the present embodiment, during the reset period of the floating diffusion FD of the read pixel, the height of the barrier under the gate of the transfer transistor (transfer gate unit) 41 is caused to be lower than that at the time of no charge transfer, so that a part of the charge of the non-read pixel is discarded to the floating diffusion FD shared with the read pixel. More specifically, a voltage lower than a voltage at the time of charge transfer, for example, a voltage of about half (so-called half bias) is applied to the gate electrode of the transfer transistor 41 as the transfer pulse TRG, so that the height of the barrier under the gate of the transfer transistor 41 is caused to be lower than that at the time of no charge transfer.

Figure 7:
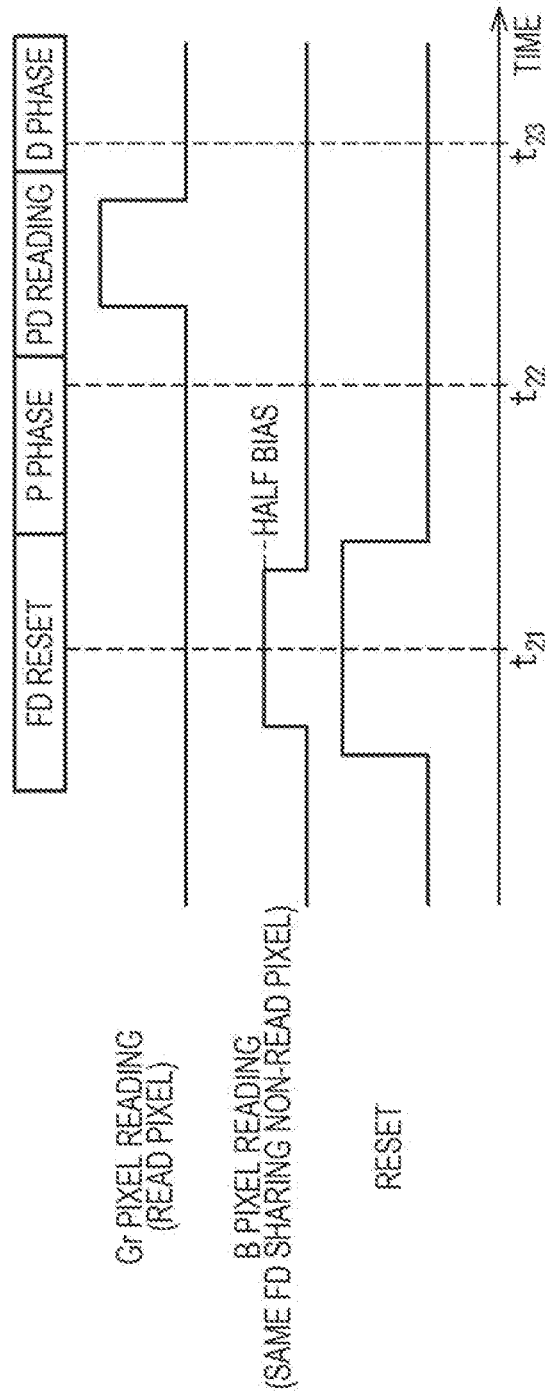
FIG. 7 is a timing chart for explaining a pixel operation according to an embodiment in a case where the technology of the present disclosure is applied.
Figure 8A:
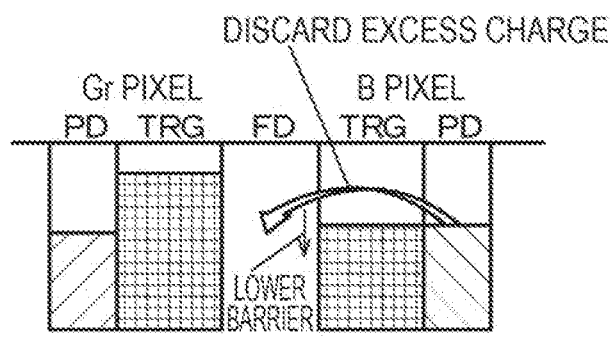
FIG. 8A is a diagram for explaining an operation at timing $t_{21}$ of FIG. 7.
Figure 8B:
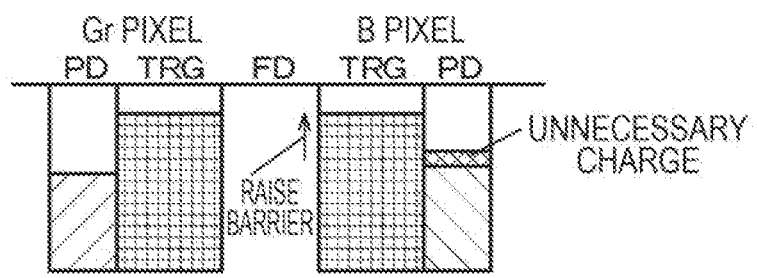
FIG. 8B is a diagram for explaining an operation at timing $t_{22}$ of FIG. 7.
Figure 8C:
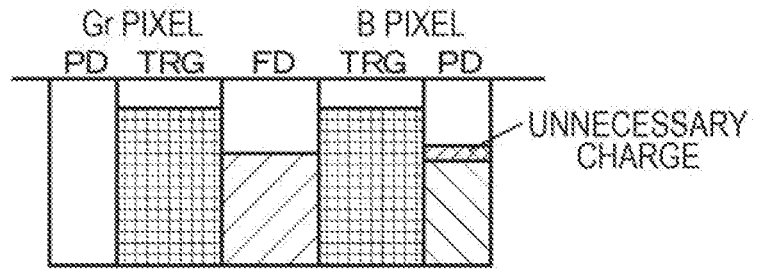
FIG. 8C is a diagram for explaining an operation at timing $t_{23}$ in FIG. 7.

This embodiment will be described in detail with reference to FIGS. 7, 8A, 8B, and 8C. FIG. 7 is a timing chart for explaining a pixel operation according to the embodiment in a case where the technology of the present disclosure is applied. FIGS. 8A, 8B and 8C are operation explanatory diagrams illustrating a potential of the photoelectric conversion unit (PD), a barrier under a gate of the transfer gate unit (transfer transistor 41), and a potential of the floating diffusion (FD) at each timing in FIG. 7.

FIG. 7 illustrates a timing relationship between the transfer pulse TRG of a pixel row including a read pixel for reading an accumulated charge, the transfer pulse TRG of a pixel row including a non-read pixel sharing the same floating diffusion 42 with the read pixel, and the reset pulse RST. Here, as an example, a read pixel is referred to as a Gr pixel and a non-read pixel is referred to as a B pixel. The transfer pulse TRG and the reset pulse RST are output from the vertical drive unit 12 illustrated in FIG. 1 through the pixel drive lines 16 ($16_1$ to $16_m$) in units of pixel rows to the unit pixel 20 (the imaging pixel 21 and the phase difference detection pixel 22).

As illustrated in FIG. 7, during the reset period of the floating diffusion FD of the read pixel, a voltage lower than a voltage at the time of charge transfer (for example, half bias) is applied as the transfer pulse TRG of the non-read pixel sharing the floating diffusion FD.

FIG. 8A illustrates a diagram for explaining an operation at timing $t_{21}$ of FIG. 7, FIG. 8B illustrates a diagram for explaining an operation at timing $t_{22}$ of FIG. 7, and FIG. 8C illustrates a diagram for explaining an operation at timing $t_{23}$ in FIG. 7. Here, the timing $t_{21}$ is a reset timing of the floating diffusion FD. The timing $t_{22}$ is a read timing for a signal (P phase) after resetting the floating diffusion FD. The timing $t_{23}$ is a timing for reading a signal (D phase) after a charge is read from the photoelectric conversion unit PD to the floating diffusion FD.

During the reset period of the floating diffusion FD of the Gr pixel which is the read pixel, as illustrated in FIG. 8A, by setting the transfer pulse TRG of the B pixel, which is a non-read pixel, to be a half bias, the height of the barrier under the gate of the transfer transistor 41 of the B pixel is caused to be lower than that at the time of no charge transfer. As a result, an excess charge of the B pixel is discarded into the floating diffusion FD in the reset state.

Before entering the period of the P phase, the transfer pulse TRG is returned to a non-transfer level. As a result, as illustrated in FIG. 8B, the height of the barrier under the gate of the transfer transistor 41 of the Gr pixel is raised to the height at the time of no charge transfer. Since the excess charge of the B pixel is discarded in the floating diffusion FD in advance, the unnecessary charge of the B pixel does not overflow to the floating diffusion FD even if the height of the barrier is raised. Then, as illustrated in FIG. 8C, during the period of the D phase, since the original signal charge of the Gr pixel is read to the floating diffusion FD, occurrence of blooming due to the overflow of the unnecessary charge from the adjacent pixel can be suppressed.

[Back-Illuminated Type Pixel Structure]

In a method for preventing blooming according to the present embodiment described above, although the unit pixel 20 can be applied to a surface illuminated type pixel structure, a more remarkable effect can be achieved when the unit pixel 20 is applied to the back-illuminated type pixel structure. Here, the term "back-illuminated type pixel structure" refers to a pixel structure in which when a first surface on a side where a wiring layer of a semiconductor substrate is formed is taken as a substrate surface, incident light is taken in (light is applied) from a second surface opposite to the first surface, that is, from a back surface side of the substrate (a backside of the semiconductor substrate). Conversely, "surface illuminated type pixel structure" refers to a pixel structure in which incident light is taken in (light is applied) from a surface side of the substrate.

Figure 9:
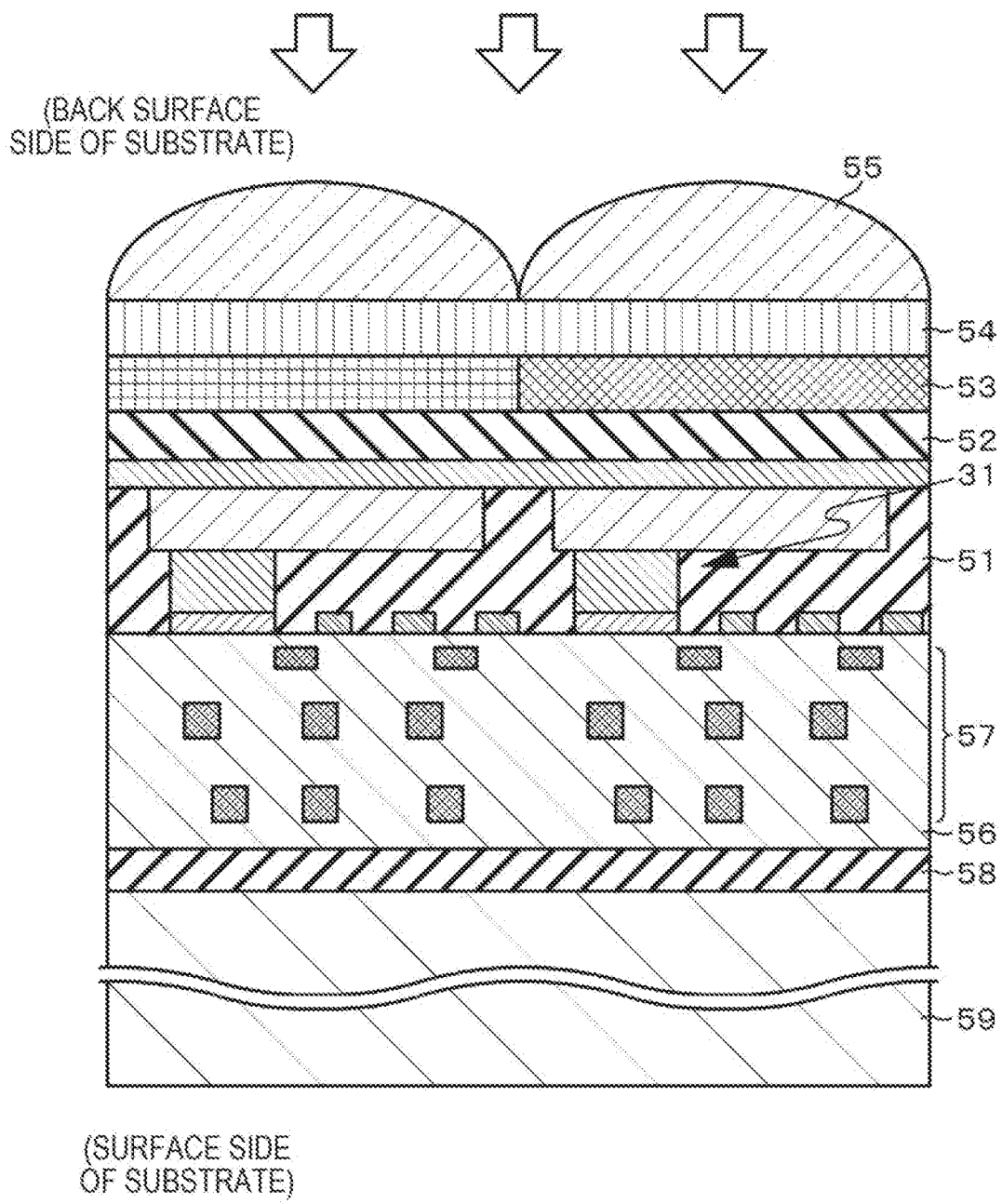
FIG. 9 is a cross-sectional view illustrating an example of a back-illuminated type pixel structure.

Here, the outline of the back-illuminated type pixel structure will be described with reference to FIG. 9. FIG. 9 is a cross-sectional view illustrating an example of the back-illuminated type pixel structure. Here, a cross-sectional structure for two pixels is illustrated.

In FIG. 9, the photoelectric conversion unit (photodiode) 31 and the pixel transistor (transistors 41 and 43 to 45 in FIG. 3) are formed on a semiconductor substrate 51. Then, a color filter 53 is formed on the back surface side of the semiconductor substrate 51 through an insulating film 52. Then, a planarizing film 54 is laminated on the color filter 53, and a microlens (on-chip lenses) 55 is laminated on the planarizing film 54 in this order.

On the other hand, in an interlayer insulating film 56 on the substrate surface side of the semiconductor substrate 51, a wiring layer 57 including a plurality of gate electrodes and metal wirings of the pixel transistors (transistors 41 and 43 to 45 in FIG. 3) is formed. Then, a support substrate 59 is bonded to the surface of the interlayer insulating film 56 opposite to the semiconductor substrate 51 by an adhesive 58.

According to the back-illuminated type pixel structure described above, in order to take in incident light from the back surface side of the substrate where the wiring layer 57 is not formed, even the photoelectric conversion unit 31 having the same area can take in a larger amount of light than the surface illuminated type pixel structure, and an image with much less noise can be captured. Furthermore, since it is not necessary to lay out each wiring of the wiring layer 57 in consideration of a light receiving surface of the photoelectric conversion unit 31, the degree of freedom in layout of the wiring is increased, so that the pixel can be made finer than the surface illuminated type pixel structure.

In a case of the surface illuminated type pixel structure, an overflow path (blooming pulse) can be formed on a bulk side, whereas in a case of the back-illuminated type pixel structure, an overflow path from the photoelectric conversion unit 31 to the floating diffusion FD (42 in FIG. 3) is obtained, as is apparent from the above-described pixel structure. Thus, in the case of the back-illuminated type pixel structure, when the floating diffusion FD is shared with the adjacent pixel, the blooming problem tends to occur compared to the case of the surface illuminated type pixel structure. Therefore, the method for preventing blooming according to the present embodiment is particularly useful when applied to the back-illuminated type pixel structure. However, the method is not limited to the back-illuminated type pixel structure, but may be applied to the surface illuminated type pixel structure.

Modification

In the above embodiment, a case where the method for preventing blooming is applied to the solid-state imaging element including the phase difference detection pixel 22 in the pixel array unit 11 has been described as an example, but the present disclosure is not limited thereto. For example, the present disclosure can be applied to a solid-state imaging element using a technology for expanding a dynamic range. The following two systems can be exemplified as technologies for expanding the dynamic range.

(1) Time division system: System of photographing in time division with different sensitivities due to difference in accumulation time, and combining a plurality of images photographed in time division manner to expand dynamic range. In this time division method, the dynamic range can be expanded by increasing the number of divisions of time division.

(2) Spatial division system: System of providing a plurality of pixels having different sensitivities of color filters, and combining a plurality of images photographed by the plurality of pixels having different sensitivities to expand dynamic range. In this spatial division system, the dynamic range can be expanded by increasing the number of divisions of spatial division.

Furthermore, as the structure of the solid-state imaging element according to the above embodiment, it is possible to adopt a so-called flat structure in which components such as the column processing unit 13, the signal processing unit 18, and the data storage unit 19 are mounted together with the pixel array unit 11 on the same semiconductor substrate. Alternatively, it is possible to adopt a so-called laminated structure in which components such as the column processing unit 13, the signal processing unit 18, and the data storage unit 19 are mounted, in a dispersed manner, on one or more other semiconductor substrates different from the semiconductor substrate on which the pixel array unit 11 is mounted, and these semiconductor substrates are laminated.

[Electronic Apparatus]

The solid-state imaging element according to the present embodiment described above can be used as an imaging unit (image taking unit) in, in general, imaging devices such as a digital still camera and a video camera, portable terminal devices having an imaging function such as a portable telephone, and electronic apparatuses such as a copying machine using a solid-state imaging element for an image reading unit. In addition, it can also be used in an in-vehicle sensor for photographing a front, rear, periphery, inside, and the like of a vehicle, a surveillance camera that monitors a traveling vehicle and a road, a device used in the field of transportation such as a distance measuring sensor for measuring a distance between vehicles or the like, and a device used in the field of medical care or health care such as an endoscope or a device for performing angiography by receiving infrared light.

Note that the solid-state imaging element may be formed as a single chip or may be a modular form having an imaging function, in which the imaging unit and the signal processing unit or an optical system are packaged together. The module-like form mounted on the electronic apparatus, that is, a case where the camera module is an imaging device may be conceivable.

<Imaging Device>

Figure 10:
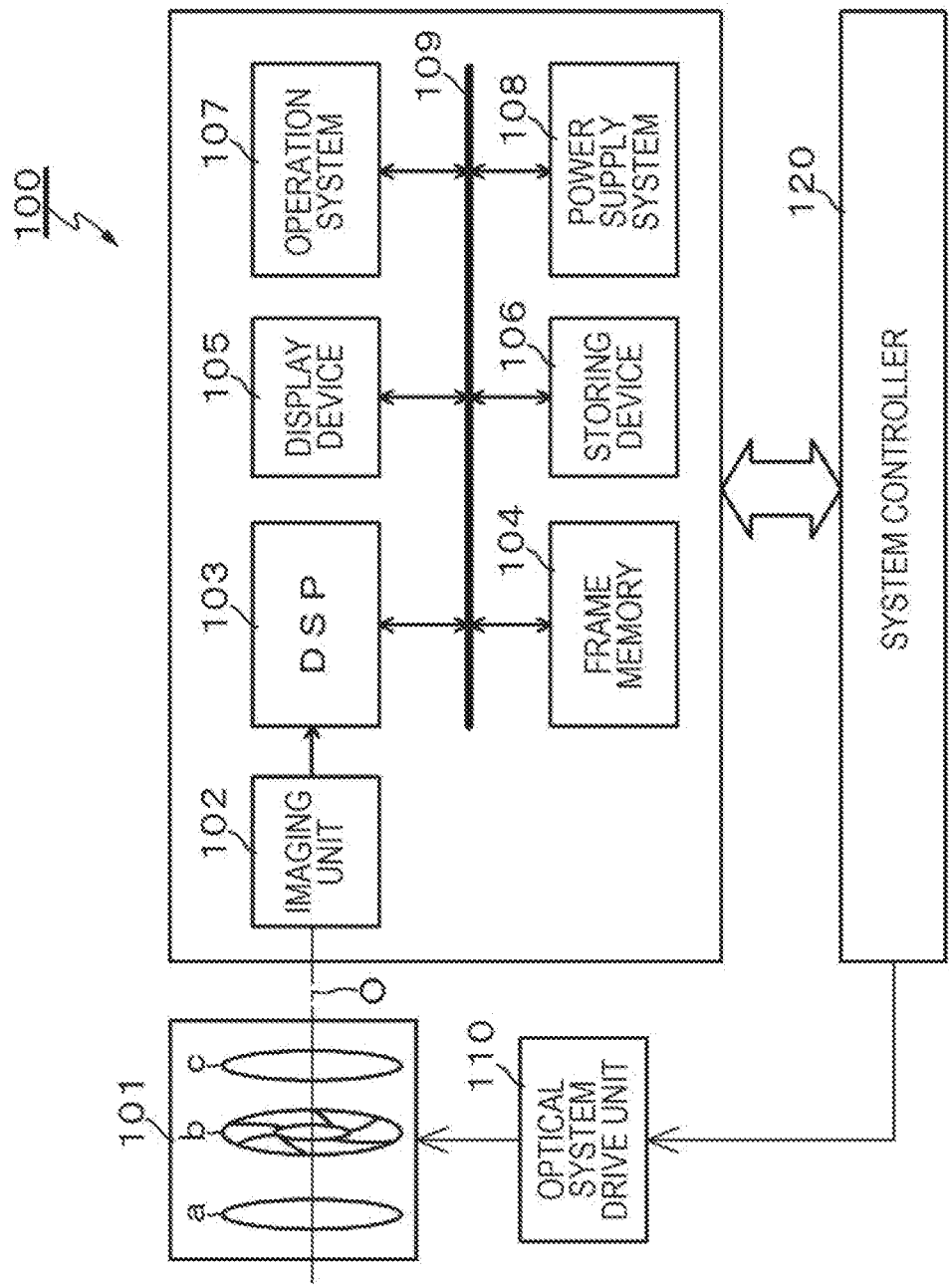
FIG. 10 is a block diagram schematically illustrating a system configuration of an imaging device which is an example of an electronic apparatus according to the present disclosure.

FIG. 10 is a block diagram schematically illustrating a system configuration of the imaging device which is an example of an electronic apparatus according to the present disclosure.

As illustrated in FIG. 10, an imaging device 100 of the present disclosure includes an imaging optical system 101, an imaging unit 102, a DSP circuit 103 serving as a camera signal processing unit, a frame memory 104, a display device 105, a recording device 106, an operation system 107, a power supply system 108, and the like. Then, the DSP circuit 103, the frame memory 104, the display device 105, the recording device 106, the operation system 107, and the power supply system 108 are connected so as to communicate with each other via a bus line 109. The imaging device 100 further includes an optical system drive unit 110 and a system controller 120.

The imaging optical system 101 includes a zoom lens a, a diaphragm b, a focus lens c, and the like, and takes in incident light (image light) from a subject and forms an image on the imaging surface of the imaging unit 102. In the imaging optical system 101, the zoom lens a changes a focal length by moving in an optical axis O direction under the driving by the optical system drive unit 110 to adjust the magnification of the subject included in the captured image. The aperture b adjusts the amount of light of the image light of the subject incident on the imaging surface of the imaging unit 102 by changing the degree of aperture under the driving by the optical system drive unit 110. The focus lens c adjusts a focus by moving in the optical axis O direction under the driving by the optical system drive unit 110.

The imaging unit 102 converts the light amount of the image light (incident light) of the subject formed on the imaging surface by the imaging optical system 101 into an electric signal in units of pixels, and outputs the electric signal as a pixel signal. As the imaging unit 102, a solid-state imaging element according to the above-described embodiment having a phase difference detection pixel in a pixel array unit and sharing a floating diffusion FD between adjacent pixels can be used.

The display device 105 includes a panel display device such as a liquid crystal display device or an organic EL (electro luminance) display device, and displays a moving image or a still image captured by the imaging unit 102. The recording device 106 records a moving image or a still image captured by the imaging unit 102 on a portable semiconductor memory, or a recording medium such as an optical disk and an HDD (Hard Disk Drive).

The operation system 107 issues an operation command regarding various functions of the present imaging device 100 under the operation by the user. The power supply system 108 appropriately supplies various power sources serving as operating power sources of the DSP circuit 103, the frame memory 104, the display device 105, the recording device 106, and the operation system 107 to these supply targets.

The optical system drive unit 110 drives the zoom lens a, the diaphragm b, the focus lens c and the like of the imaging optical system 101 under the control of the system controller 120. The system controller 120 performs various controls such as controlling the autofocus of the imaging optical system 101 and controlling each of the above-described components.

With respect to the control of the autofocus, on the basis of the phase difference detection signal output from the phase difference detection pixel in the solid-state imaging element according to the above-described embodiment, for example, the DSP circuit 103 performs arithmetic processing for calculating a focal shift direction and the amount of a focal shift. In response to the arithmetic result, the system controller 120 performs focus control to bring the focus lens c into focus (focus) by moving the focus lens c in the optical axis O direction via the optical system drive unit 110.

As described above, by using the solid-state imaging element according to the above-described embodiment as the imaging unit 102, the following actions and effects can be obtained. That is, according to the solid-state imaging element, since the charge of the non-read pixel can be prevented from flowing into the floating diffusion of the adjacent pixel sharing the floating diffusion, the occurrence of blooming due to the overflow of the unnecessary charge from the adjacent pixel can be suppressed. Therefore, by using the solid-state imaging element according to the above-described embodiment as the imaging unit 102, it is possible to obtain a captured image having high quality without blooming.

[Configuration that Present Disclosure can Take]

Note that the present disclosure may have the following structure.

[1] A solid-state imaging element including:

a pixel array unit in which unit pixels each including a photoelectric conversion unit are arranged two-dimensionally in a matrix, and a floating diffusion is shared between a plurality of the unit pixels; and a drive unit that drives to discard, into the floating diffusion, a part of a charge of a non-read pixel sharing the floating diffusion with a read pixel, during a reset period of the floating diffusion of the read pixel for reading the charge.

[2] The solid-state imaging element according to the above [1], in which during a reset period of the floating diffusion of the read pixel, the drive unit causes a height of a barrier under a gate of a transfer gate unit between the photoelectric conversion unit of the non-read pixel and the floating diffusion to be lower than a height of the barrier at a time of no charge transfer.

[3] The solid-state imaging element according to the above [2], in which the drive unit applies a voltage lower than a voltage at a time of charge transfer to a gate electrode of the transfer gate unit during the reset period of the floating diffusion of the read pixel.

[4] The solid-state imaging element according to any one of [1] to [3], in which the non-read pixel sharing the floating diffusion is a phase difference detection pixel for performing phase difference detection for measuring a distance from a subject using a phase difference of a subject image.

[5] The solid-state imaging element according to the above [4], in which the phase difference detection pixel has a first photoelectric conversion unit and a second photoelectric conversion unit, the first photoelectric conversion unit shares the floating diffusion with a pixel adjacent to a first side of the phase difference detection pixel, and the second photoelectric conversion unit shares the floating diffusion with a pixel adjacent to a second side of the phase difference detection pixel.

[6] The solid-state imaging element according to any one of [1] to [5], in which each of the unit pixels has a back-illuminated type pixel structure.

[7] A method for driving a solid-state imaging element including:

in driving a solid-state imaging element in which unit pixels each including a photoelectric conversion unit are arranged two-dimensionally in a matrix, and a floating diffusion is shared between a plurality of the unit pixels, discarding, into the floating diffusion, a part of a charge of a non-read pixel sharing the floating diffusion with a read pixel, during a reset period of the floating diffusion of the read pixel for reading the charge.

[8] The method for driving a solid-state imaging element according to the above [7], including, during a reset period of the floating diffusion of the read pixel, causing a height of a barrier under a gate of a transfer gate unit between the photoelectric conversion unit of the non-read pixel and the floating diffusion to be lower than a height of the barrier at a time of no charge transfer.

[9] The method for driving a solid-state imaging element according to the above [8], including applying a voltage lower than a voltage at a time of charge transfer to a gate electrode of the transfer gate unit during the reset period of the floating diffusion of the read pixel.

[10] The method for driving a solid-state imaging element according to any one of [7] to [9], in which the non-read pixel sharing the floating diffusion is a phase difference detection pixel for performing phase difference detection for measuring a distance from a subject using a phase difference of a subject image.

[11] The method for driving a solid-state imaging element according to the above [10], in which the phase difference detection pixel has a first photoelectric conversion unit and a second photoelectric conversion unit, the first photoelectric conversion unit shares the floating diffusion with a pixel adjacent to a first side of the phase difference detection pixel, and the second photoelectric conversion unit shares the floating diffusion with a pixel adjacent to a second side of the phase difference detection pixel.

[12] The method for driving a solid-state imaging element according to any one of [7] to [11], in which each of the unit pixels has a back-illuminated type pixel structure.

[13] An electronic apparatus having a solid-state imaging element including:

a pixel array unit in which unit pixels each including a photoelectric conversion unit are arranged two-dimensionally in a matrix, and a floating diffusion is shared between a plurality of the unit pixels; and a drive unit that drives to discard, into the floating diffusion, a part of a charge of a non-read pixel sharing the floating diffusion with a read pixel, during a reset period of the floating diffusion of the read pixel for reading the charge.

REFERENCE SIGNS LIST

10 Solid-state imaging element
11 Pixel array unit
12 Vertical drive unit
13 Column processing unit
14 Vertical drive unit
15 System control unit
16 ($16_1$ to $16_m$) Pixel drive line
17 ($17_1$ to $17_n$) Vertical signal line
18 Signal processing unit
19 Data storage unit
20 Unit pixel
21 Imaging pixel
22 Phase difference detection pixel
31, 32A, 32B Photoelectric conversion unit
41 Transfer transistor (transfer gate unit)

42 Floating diffusion (FD)
43 Reset transistor
44 Amplification transistor
45 Selection transistor

The invention claimed is:

1. A solid-state imaging element, comprising:
a pixel array unit including a plurality of unit pixels and a floating diffusion, wherein
each of the plurality of unit pixels includes a photoelectric conversion unit,
the plurality of unit pixels is arranged two-dimensionally in a matrix,
the floating diffusion is shared between the plurality of unit pixels, and
the plurality of unit pixels includes a read pixel and a non-read pixel; and
a drive unit configured to drive the plurality of unit pixels to discard, into the floating diffusion, a part of a charge of the non-read pixel that shares the floating diffusion with the read pixel, wherein
the part of the charge of the non-read pixel is discarded during a reset period of the floating diffusion of the read pixel, and
the read pixel is configured to read the charge.

2. The solid-state imaging element according to claim 1, wherein
during the reset period of the floating diffusion of the read pixel, the drive unit is further configured to cause a first height of a barrier under a gate of a transfer gate unit to be lower than a second height of the barrier at a time of no charge transfer, and
the transfer gate unit is between the floating diffusion and the photoelectric conversion unit of the non-read pixel.

3. The solid-state imaging element according to claim 2, wherein
the drive unit is further configured to apply, during the reset period of the floating diffusion of the read pixel, a first voltage to a gate electrode of the transfer gate unit, and
the first voltage is lower than a second voltage at a time of charge transfer.

4. The solid-state imaging element according to claim 1, wherein
the non-read pixel is a phase difference detection pixel,
the phase difference detection pixel is configured to perform phase difference detection for measurement of a distance of the solid-state imaging element from a subject, and
the measurement of the distance is based on a phase difference of a subject image.

5. The solid-state imaging element according to claim 4, wherein
the phase difference detection pixel includes a first photoelectric conversion unit and a second photoelectric conversion unit,
the first photoelectric conversion unit shares the floating diffusion with a first unit pixel of the plurality of unit pixels,
the first unit pixel is adjacent to a first side of the phase difference detection pixel,
the second photoelectric conversion unit shares the floating diffusion with a second unit pixel of the plurality of unit pixels, and
the second unit pixel is adjacent to a second side of the phase difference detection pixel.

6. The solid-state imaging element according to claim 1, wherein
each of the plurality of unit pixels has a back-illuminated type pixel structure.

7. A method for driving a solid-state imaging element, comprising:
in the solid-state imaging element that comprises a pixel array unit, wherein the pixel array unit includes a plurality of unit pixels and a floating diffusion, each of the plurality of unit pixels includes a photoelectric conversion unit, the plurality of unit pixels is arranged two-dimensionally in a matrix, the floating diffusion is shared between the plurality of unit pixels, and the plurality of unit pixels includes a read pixel and a non-read pixel:
discarding, into the floating diffusion, a part of a charge of the non-read pixel that shares the floating diffusion with the read pixel, wherein
the part of the charge of the non-read pixel is discarded during a reset period of the floating diffusion of the read pixel, and
the read pixel is configured to read the charge.

8. The method for driving the solid-state imaging element according to claim 7, further comprising:
during the reset period of the floating diffusion of the read pixel, causing a first height of a barrier under a gate of a transfer gate unit to be lower than a second height of the barrier at a time of no charge transfer, wherein
the transfer gate unit is between the floating diffusion and the photoelectric conversion unit of the non-read pixel.

9. The method for driving the solid-state imaging element according to claim 8, further comprising:
applying, during the reset period of the floating diffusion of the read pixel, a first voltage to a gate electrode of the transfer gate unit,
wherein the first voltage is lower than a second voltage at a time of charge transfer.

10. The method for driving the solid-state imaging element according to claim 7, wherein
the non-read pixel sharing the floating diffusion is a phase difference detection pixel,
the method further comprises performing, by the phase difference detection pixel, phase difference detection for measuring a distance of the solid-state imaging element from a subject, and
the measurement of the distance is based on a phase difference of a subject image.

11. The method for driving the solid-state imaging element according to claim 10, wherein
the phase difference detection pixel has a first photoelectric conversion unit and a second photoelectric conversion unit,
the first photoelectric conversion unit shares the floating diffusion with a first unit pixel of the plurality of unit pixels,
the first unit pixel is adjacent to a first side of the phase difference detection pixel,
the second photoelectric conversion unit shares the floating diffusion with a second unit pixel of the plurality of unit pixels, and
the second unit pixel is adjacent to a second side of the phase difference detection pixel.

12. The method for driving the solid-state imaging element according to claim 7, wherein
each of the plurality of unit pixels has a back-illuminated type pixel structure.

13. An electronic apparatus, comprising:
a solid-state imaging element that comprises:
   a pixel array unit including a plurality of unit pixels and a floating diffusion, wherein
      each of the plurality of unit pixels includes a photoelectric conversion unit,
      the plurality of unit pixels is arranged two-dimensionally in a matrix,
      the floating diffusion is shared between the plurality of unit pixels, and
      the plurality of unit pixels includes a read pixel and a non-read pixel; and
   a drive unit configured to drive the plurality of unit pixels to discard, into the floating diffusion, a part of a charge of the non-read pixel that shares the floating diffusion with the read pixel, wherein
      the part of the charge of the non-read pixel is discarded during a reset period of the floating diffusion of the read pixel, and
      the read pixel is configured to read the charge.

* * * * *